United States Patent
Epperson et al.

(10) Patent No.: US 7,110,724 B1
(45) Date of Patent: Sep. 19, 2006

(54) SYSTEM AND METHOD FOR DETECTING COMPRESSION OF A POWER AMPLIFIER CIRCUIT

(75) Inventors: Darrell Epperson, Oak Ridge, NC (US); Doug MacArthur, Greensboro, NC (US)

(73) Assignee: RF Micro Devices, Inc., Greensboro, NC (US)

(*) Notice: Subject to any disclaimer, the term of this patent is extended or adjusted under 35 U.S.C. 154(b) by 106 days.

(21) Appl. No.: 11/014,084

(22) Filed: Dec. 16, 2004

(51) Int. Cl.
*H04B 1/00* (2006.01)
(52) U.S. Cl. .................................. 455/72; 455/126
(58) Field of Classification Search ............... 330/149; 333/14; 375/97; 455/72, 570, 126, 63
See application file for complete search history.

(56) References Cited

U.S. PATENT DOCUMENTS

| | | | |
|---|---|---|---|
| 5,278,994 A | 1/1994 | Black et al. | ............... 455/126 |
| 6,047,168 A * | 4/2000 | Carlsson et al. | ............. 455/126 |
| 6,125,266 A * | 9/2000 | Matero et al. | .............. 455/126 |
| 6,633,750 B1 * | 10/2003 | Dacus et al. | ................ 455/126 |

* cited by examiner

*Primary Examiner*—Henry Choe
(74) *Attorney, Agent, or Firm*—Withrow & Terranova, PLLC

(57) ABSTRACT

A system and method for detecting compression of power amplifier circuitry in a wireless terminal and, in response, reducing the output power of the power amplifier circuitry such that linear operation is achieved. In general, the output power of the power amplifier is detected to provide a detect signal. The detect signal is sampled at two predetermined points in time. A ratio of the samples of the detect signal is compared to an expected ratio. Based on the comparison, a decision is made as to whether the power amplifier circuitry is in compression. If so, an adjustable power control signal controlling the output power of the power amplifier circuitry is reduced by one power step, such that the output power of the power amplifier circuitry is reduced by one output power level. The process is repeated until the power amplifier circuitry returns to linear operation.

29 Claims, 5 Drawing Sheets

SYSTEM AND METHOD FOR DETECTING COMPRESSION OF A POWER AMPLIFIER CIRCUIT

FIELD OF THE INVENTION

The present invention relates to power amplifiers for wireless terminals, and more particularly relates to a system and method for detecting compression of a power amplifier and correcting output power such that the power amplifier operates linearly.

BACKGROUND OF THE INVENTION

Wireless terminals, such as mobile telephones, wireless local area network (LAN) devices, and the like, include power amplifiers, such as linear power amplifiers, to amplify radio frequency (RF) signals prior to transmission. Linear power amplifiers rely on constant load impedance in order to reproduce the desired input signal at the output of the power amplifier. In real world environments, the load impedance changes due to factors such as the antenna coming into close proximity to a foreign metal object or the user's body. Consequently, the compression points of the power amplifier change, which leads to premature saturation of the power amplifier and failure of the Error Vector Magnitude (EVM) and spectral re-growth specifications for the system. Accordingly, saturation of the power amplifier must be avoided in order to provide a linear transfer function between input and output signals of the power amplifier and meet EVM and spectral re-growth specifications for the desired mobile communications system.

Thus, there remains a need for a system and method for detecting compression of a power amplifier, and, in response to detecting compression of the power amplifier, lowering the output power of the power amplifier to achieve linear operation.

SUMMARY OF THE INVENTION

The present invention provides a system and method for detecting compression of power amplifier circuitry in a wireless terminal and, in response, reducing the output power of the power amplifier circuitry such that linear operation is achieved. In general, the output power of the power amplifier is detected to provide a detect signal. The detect signal is sampled at two predetermined points in time. A ratio of the samples of the detect signal is compared to an expected ratio. Based on the comparison, a decision is made as to whether the power amplifier circuitry is in compression. If so, an adjustable power control signal controlling the output power of the power amplifier circuitry is reduced by a number of power steps, such that the output power of the power amplifier circuitry is reduced. The process is repeated until the power amplifier circuitry returns to linear operation.

In one embodiment, in response to determining that the power amplifier circuitry is in saturation, the number of power steps by which the adjustable power control signal is reduced is a fixed number of power steps, such as one. In another embodiment, the number of power steps by which the adjustable power control signal is reduced is based on an amount by which the ratio of the samples of the detect signal is less than the expected ratio. The number of power steps increases as the amount by which the ratio of the samples is less than the expected ratio increases. Thus, when the power amplifier circuitry is slightly in compression, the adjustable power control signal may be reduced by one power step. When the power control circuitry is far into compression, the adjustable power control signal may be reduced by two or more power steps.

Periodically, after a predetermined amount of time has lapsed since the adjustable power control signal was last compared to its ideal value, the adjustable power control signal is compared to its ideal value. If the adjustable power control signal has been previously reduced such that it is not equal to its desired value, the adjustable power control signal is increased by one power step. This process is repeated until the adjustable power control signal is increased to its ideal value or the power amplifier circuitry enters compression. In this manner, the output power of the power amplifier circuitry is not unnecessarily reduced once the factor causing premature compression is removed.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 1:
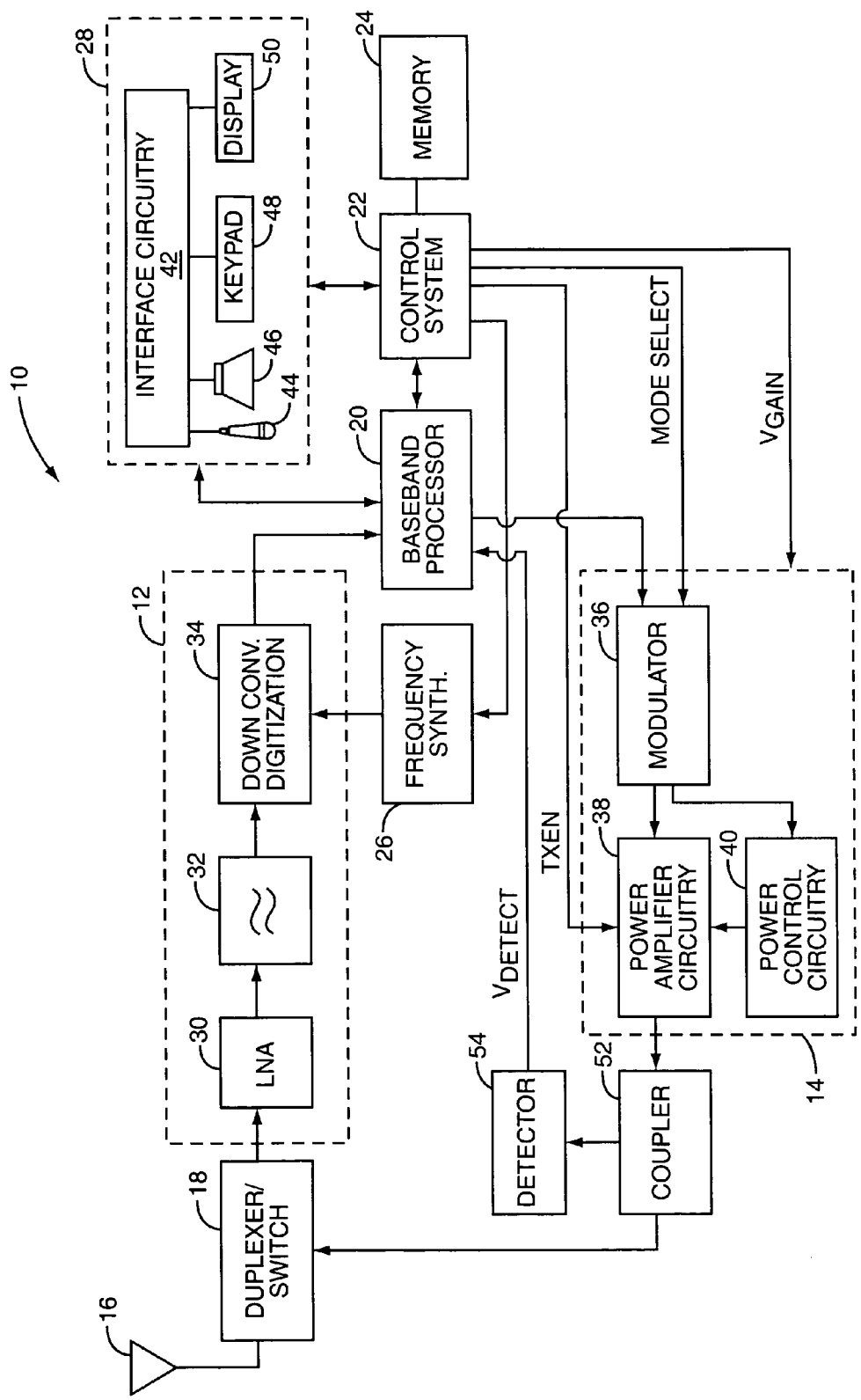
FIG. 1 illustrates an exemplary wireless terminal including coupler circuitry, detector circuitry, and a baseband processor operating to detect compression of the power amplifier circuitry and adjust operation of the power amplifier such that it operates linearly according to one embodiment of the present invention.
Figure 3A:
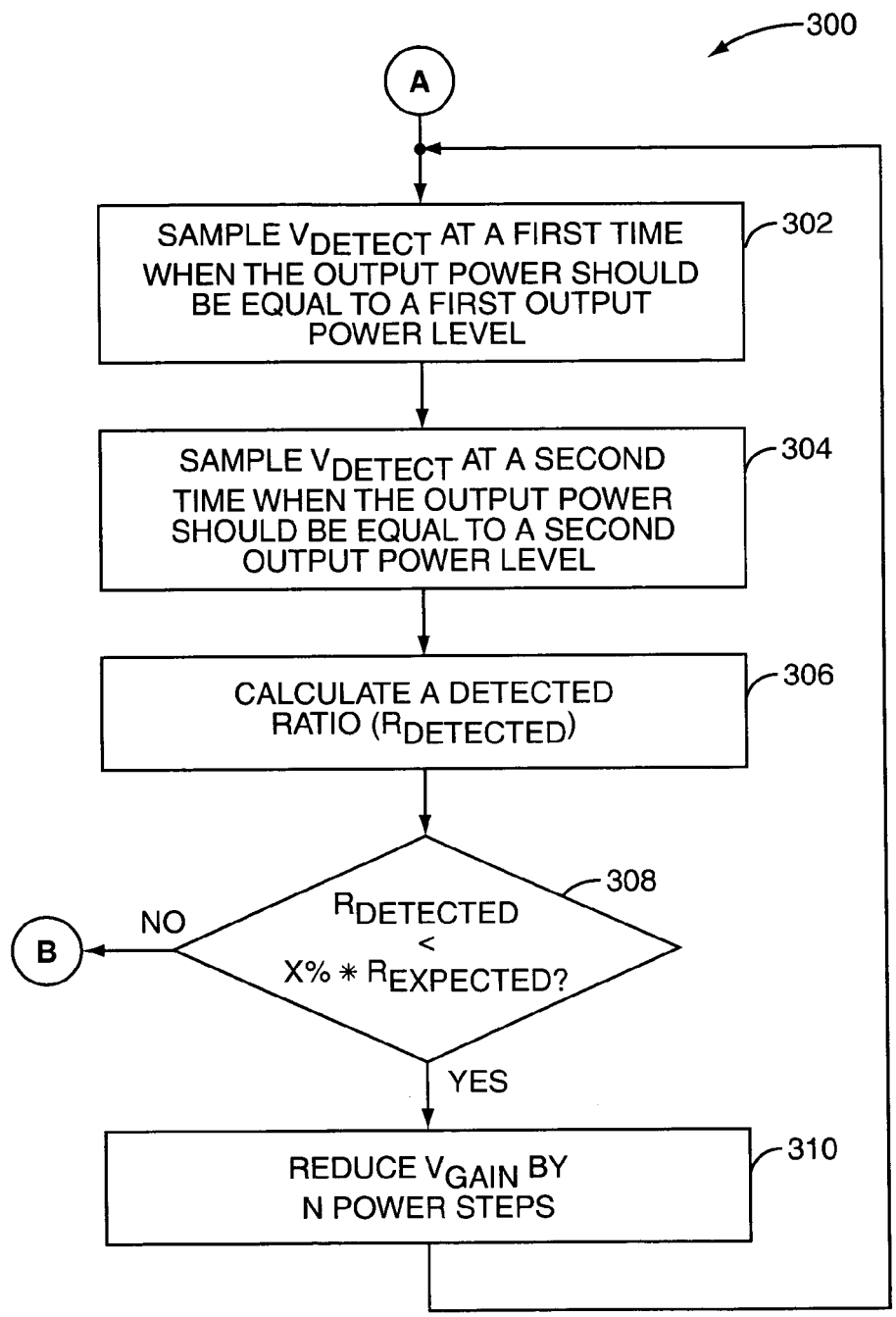
Figure 3B:
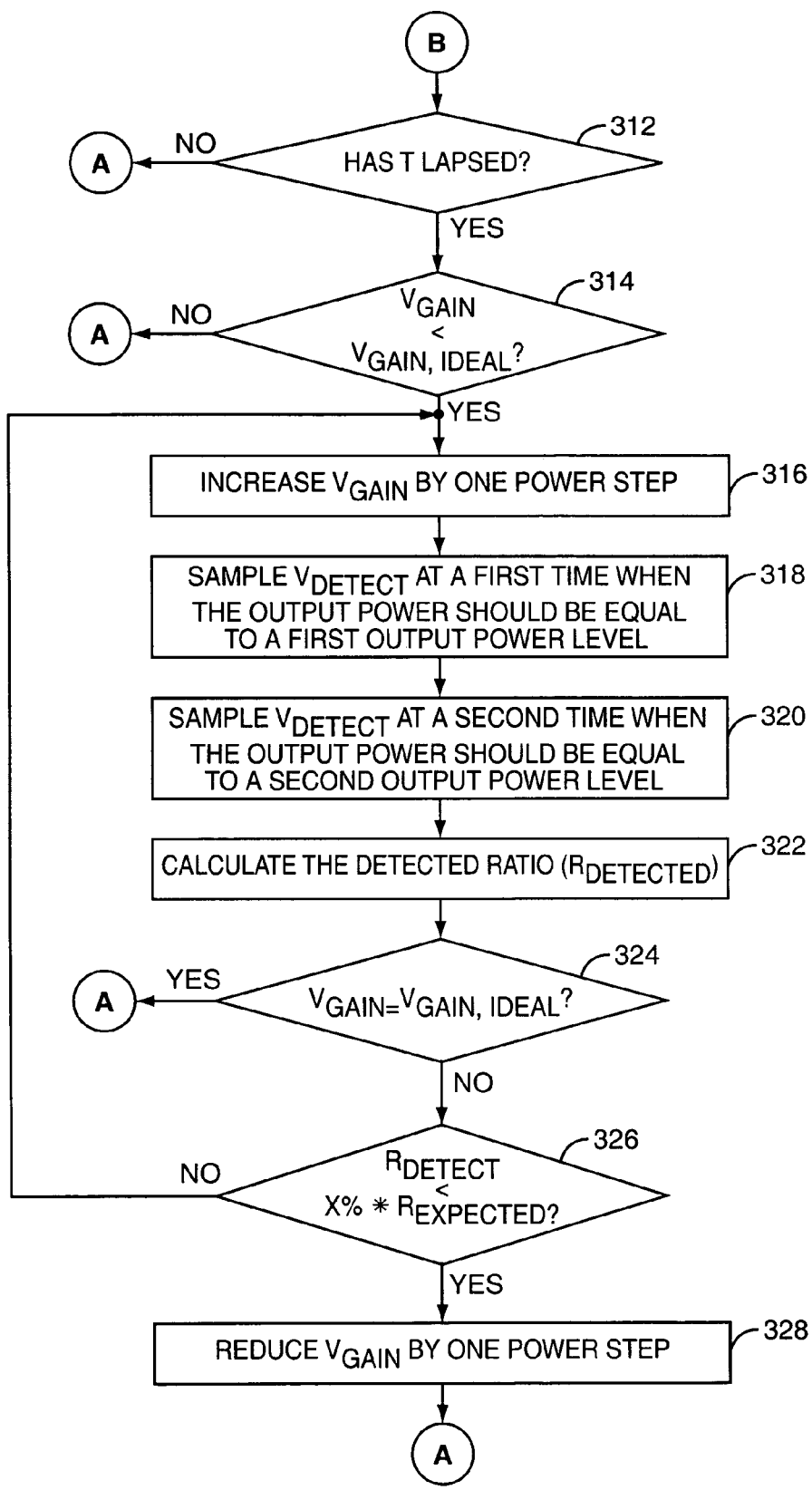
Figure 4:
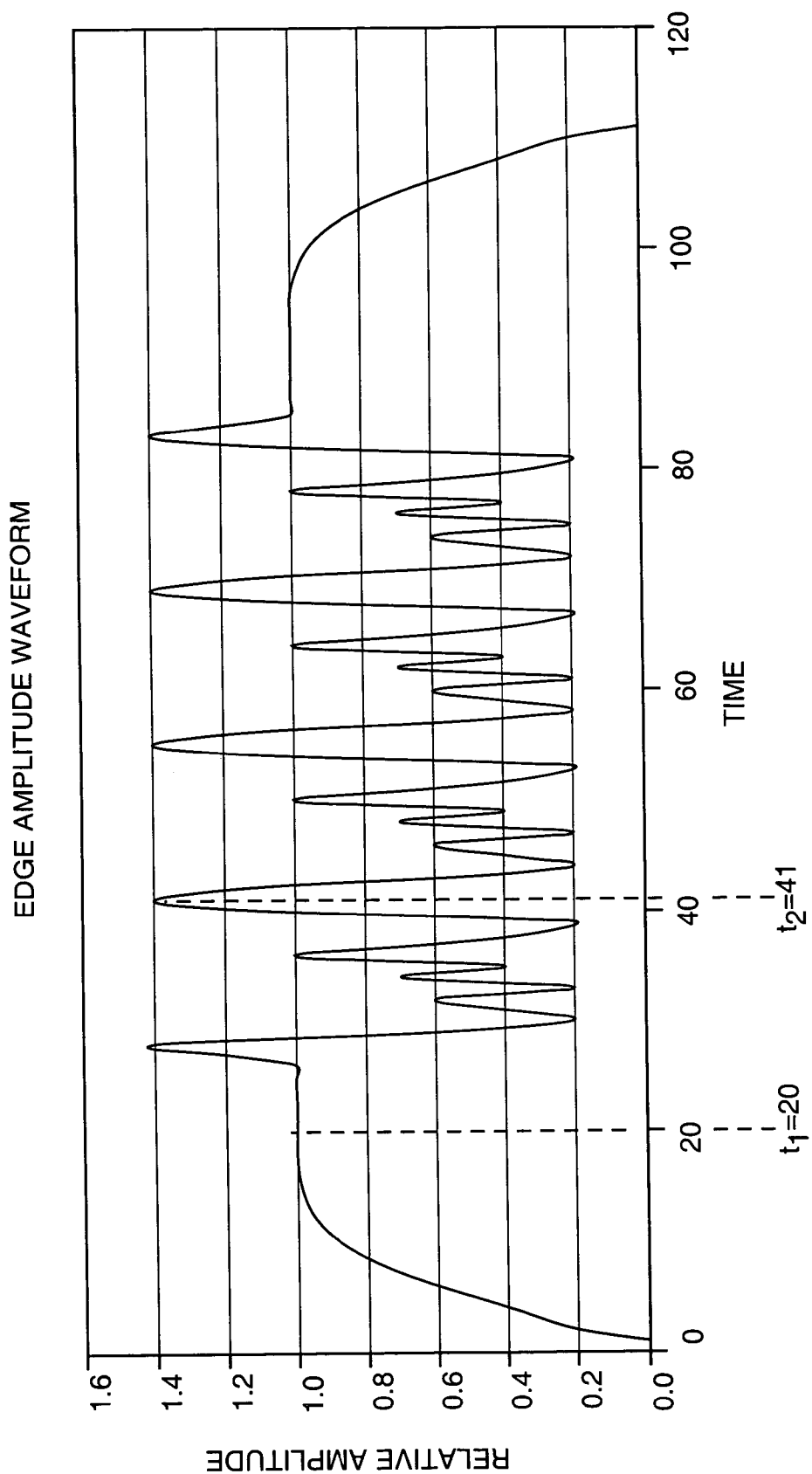

FIGS. 3A and 3B illustrate an algorithm for detecting compression of the power amplifier circuitry and adjusting the output power of the power amplifier circuitry such that it operates linearly according to one embodiment of the present invention; and FIG. 4 is an exemplary illustration of an amplitude waveform present at the output of the power amplifier circuitry of FIG. 1 during a transmit burst showing times at which samples of a detect signal correlated to the output power are sampled according to the algorithm of FIGS. 3A and 3B.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is preferably incorporated in a wireless terminal 10, such as a mobile telephone, personal digital assistant, personal computer, wireless local area network (LAN) device, base station in a wireless communication network, or the like. The basic architecture of a wireless terminal 10 is represented in FIG. 1 and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station. A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 36 to modulate a carrier signal that is at a desired transmit frequency. Power amplifier circuitry 38 amplifies the modulated carrier signal to a level appropriate for transmission from the antenna 16. As described in further detail below, the power amplifier circuitry 38 provides gain for the signal to be transmitted under control of power control circuitry 40, which is controlled using an adjustable power control signal ($V_{GAIN}$) provided by the control system 22. The adjustable power control signal ($V_{GAIN}$) may be provided to the power control circuitry 40 or the modulator 36 depending on the particular implementation.

For exemplary embodiments of the power amplifier circuitry 38 and the power control circuitry 40, see commonly owned and assigned U.S. Pat. No. 6,701,138, entitled POWER AMPLIFIER CONTROL, issued Mar. 2, 2004; U.S. patent application Ser. No. 10/887,744, entitled TAILORED COLLECTOR VOLTAGE TO MINIMIZE VARIATION IN AM TO PM DISTORTION IN A POWER AMPLIFIER, filed Jul. 9, 2004; and U.S. patent application Ser. No. 10/920,073, entitled POWER AMPLIFIER CONTROL USING A SWITCHING POWER SUPPLY, filed Aug. 17, 2004, which are assigned to RF Micro Devices, Inc. of 7628 Thorndike Road, Greensboro, N.C. 27409 and hereby incorporated herein by reference in their entireties.

It should be noted that in one embodiment, the modulator 36 may be a polar modulator providing amplitude and phase components of a polar modulation signal. For example, the modulator 36 is a polar modulator when the wireless terminal 10 operates in an Enhanced Data Rates for Global Evolution (EDGE) mode of the Global System for Mobile Communications (GSM) standard. In this embodiment, the modulator 36 may combine the amplitude component with the adjustable power control signal ($V_{GAIN}$), and provide the combined signal to the power control circuitry 40. For an exemplary embodiment of a polar modulator, see commonly owned and assigned U.S. patent application Ser. No. 10/139,560, entitled DIRECT DIGITAL POLAR MODULATOR, filed on May 6, 2002, which is hereby incorporated by reference in its entirety.

In one embodiment, the bias for the power amplifier circuitry 38 is relatively stable regardless of power, and varying the voltage supplied to the power amplifier circuitry 38 controls actual power levels. The control system 22 may also provide a transmit enable signal (TXEN) to effectively enable the power amplifier circuitry 38 during periods of transmission.

A user may interact with the wireless terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the I/O and interface circuitry 42. The keypad 48 and display 50 enable the user to interact with the wireless terminal 10, input numbers to be dialed, address book information, or the like, as well as monitor call progress information.

According to an exemplary embodiment of the present invention, the wireless terminal 10 also includes coupler circuitry 52 and detector circuitry 54. As will be apparent to one of ordinary skill in the art, the coupler circuitry 52 is an electromagnetic coupler which couples the output signal of the power amplifier circuitry 38 into the input of the detector circuitry 54 without causing excessive loss at the output of the power amplifier circuitry 38.

The detector circuitry 54 operates to detect either an output power of the power amplifier circuitry 38 or a voltage at the output of the power amplifier circuitry 38, and provide a detect signal ($V_{DETECT}$) proportional to the detected output power or voltage to the baseband processor 20. As illustrated, in this embodiment, the detector circuitry 54 is coupled to the output of the power amplifier circuitry 38 by the coupler circuitry 52. The detector circuitry 54 may include analog-to-digital conversion circuitry such that the detect signal ($V_{DETECT}$) is a digital signal. Alternatively, the detect signal ($V_{DETECT}$) may be an analog signal, and the baseband processor 20 may include analog-to-digital conversion circuitry in order to digitize the detect signal ($V_{DETECT}$). It should be noted that, in another embodiment, the detector circuitry 54 may be a current detector and arranged such that it detects a current provided from the power control circuitry 40 to the power amplifier circuitry 38. For an example of a current detector that detects the current provided from the power control circuitry 40 to the power amplifier circuitry 38 see commonly owned and assigned U.S. Provisional Patent Application Ser. No. 60/603,129, entitled SYSTEM FOR LIMITING CURRENT IN AN OUTPUT STAGE OF A POWER AMPLIFIER, which was filed on Aug. 20, 2004 and is hereby incorporated herein by reference in its entirety.

As discussed below in more detail, the baseband processor 20 operates to detect compression of the power amplifier circuitry 38 based on samples of the detect signal ($V_{DETECT}$). If the power amplifier circuitry 38 is in compression, the baseband processor 20 iteratively reduces the adjustable power control signal ($V_{GAIN}$) by N power steps, which corresponds to reducing the output power level of the power amplifier circuitry 38 by N power levels, until the power amplifier circuitry 38 is no longer in compression. In one embodiment, the number N is one. In another embodiment, the number N may be any integer greater than or equal to one, as described below in more detail. It should be noted that the samples of the detect signal ($V_{DETECT}$) are taken during a transmit burst, but the adjustments to the adjustable power control signal ($V_{GAIN}$) are made for the next transmit burst to avoid changing the adjustable power control signal ($V_{GAIN}$) during a transmit burst.

Figure 2:
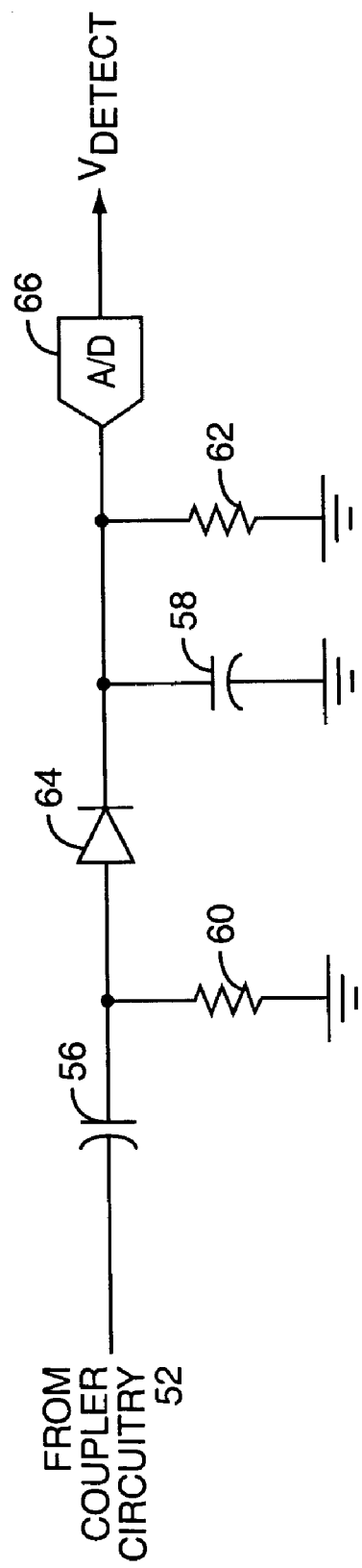
FIG. 2 illustrates an exemplary embodiment of the detector circuitry of FIG. 1.

FIG. 2 is a detailed illustration of an exemplary embodiment of the detector circuitry 54. It should be noted that many variations of the detector circuitry 54 will be apparent to one of ordinary skill in the art upon reading this disclosure, and this exemplary embodiment should not be construed as limiting the scope of the present invention. In this embodiment, the detector circuitry 54 is a capacitively coupled diode voltage detector. The operation of the capacitively coupled diode voltage detector will be apparent to one of ordinary skill in the art. In general, the detector circuitry 54 includes capacitors 56, 58, resistors 60, 62, and a diode 64 arranged as shown. The capacitor 56 couples the AC component of the output signal of the coupler circuitry 52 to the input of the diode 64. When the voltage at the input of the diode 64 is greater than a voltage across the capacitor 58 plus a threshold voltage of the diode, which is defined by the characteristics of the diode 64, the diode begins to conduct, thereby charging the capacitor 58. When the voltage at the input of the diode 64 falls below the threshold voltage plus the voltage across the capacitor 58, the diode 64 turns off, and the voltage across the capacitor 58 begins to be dissipated through the resistor 62 such that the voltage across the capacitor 58 decreases. Thus, in effect, the voltage across the capacitor 58, and thus the detect signal ($V_{DETECT}$), tracks the peak of the signal from the coupler circuitry 52, thereby providing the detect signal ($V_{DETECT}$) that is correlated to the output power of the power amplifier circuitry 38.

The voltage across the capacitor 58 is digitized by an analog-to-digital (A/D) converter 66 to provide the detect signal ($V_{DETECT}$). It should be noted that the A/D converter 66 may be part of the detector circuitry 54, part of the baseband processor 20, or external to both the detector circuitry 54 and the baseband processor 20. As discussed below, the baseband processor 20 samples the detect signal ($V_{DETECT}$) in order to detect compression of the power amplifier circuitry 38. In one embodiment, the baseband processor 20 may sample the detect signal ($V_{DETECT}$) by controlling a clock signal or an enable signal provided to the A/D converter 66 such that the output of the A/D converter 66 is updated only when the baseband processor 20 desires to sample the detect signal ($V_{DETECT}$). Alternatively, the A/D converter 66 may operate at all times, and the baseband processor 20 may sample the detect signal ($V_{DETECT}$) when desired.

FIGS. 3A and 3B illustrate an algorithm 300 for detecting compression of the power amplifier circuitry 38 based on samples of the detect signal ($V_{DETECT}$) and correcting the adjustable power control signal ($V_{GAIN}$) until the power amplifier circuitry 38 is out of compression, or operating linearly. In other words, the baseband processor 20 detects when the power amplifier circuitry 38 is in compression, and adjusts the adjustable power control signal ($V_{GAIN}$) such that the power amplifier circuitry 38 operates linearly.

More specifically, referring to FIG. 3A, the algorithm 300 begins by sampling the detect signal ($V_{DETECT}$) at a first time when the output power of the power amplifier circuitry 38 (FIG. 1) is ideally equal to a first output power level (step 302). Next, the detect signal ($V_{DETECT}$) is sampled at a second time when the output power is ideally equal to a second output power level (step 304). A detected ratio ($R_{DETECTED}$) is then calculated as a ratio of the first and second samples of the detect signal ($V_{DETECT}$) obtained in steps 302 and 304 (step 306). The detected ratio ($R_{DETECTED}$) is then compared to an expected ratio ($R_{EXPECTED}$) (step 308). The expected ratio ($R_{EXPECTED}$) for the first and second samples is known by the baseband processor 20 based on the ideal output power values at the first and second times at which the detect signal ($V_{DETECT}$) is sampled. This is due to the fact that the baseband processor 20 can determine the expected, or ideal, output power at any time based on the output power level at that time and the data that it has provided to the modulator 36. Accordingly, in one embodiment, the expected ratio ($R_{EXPECTED}$) is a ratio of the expected output powers at the first and second times at which the detect signal ($V_{DETECT}$) was sampled.

If the detected ratio ($R_{DETECTED}$) is less than a predetermined percentage (X %) of the expected ratio ($R_{EXPECTED}$), then the power amplifier circuitry 38 is in compression. Otherwise, the power amplifier circuitry 38 is not in compression. The exact value of the predetermined percentage (X %) depends on the particular implementation. As an example, the predetermined percentage (X %) may be selected such that the value X %*$R_{EXPECTED}$ corresponds to a 1 dB compression point of the power amplifier circuitry 38. As another example, the predetermined percentage (X %) may be 80%. The predetermined percentage (X %) avoids the situation where the baseband processor 20 would erroneously detect compression when the power amplifier circuitry 38 is operating linearly. More specifically, even under normal operating conditions, the detected ratio ($R_{DETECTED}$) may be slightly less than the expected, or ideal, ratio ($R_{EXPECTED}$). The predetermined percentage (X %) provides a threshold between normal linear operation and compression.

If the power amplifier circuitry 38 is in compression, the baseband processor 20 reduces the adjustable power control signal ($V_{GAIN}$) by N power steps (step 310). The baseband processor 20 preferably includes a look-up table storing values for the adjustable power control signal ($V_{GAIN}$) for each possible output power level of the power amplifier circuitry 38. In one embodiment, the number N of power steps is one, and to reduce the adjustable power control signal ($V_{GAIN}$) by one power step, the baseband processor 20 reduces the adjustable power control signal ($V_{GAIN}$) to a value corresponding to the next lowest output power level. In another embodiment, the number N may be any integer greater than or equal to one and is based on the amount by which the detected ratio ($R_{DETECTED}$) is less than the predetermined percentage (X %) of the expected ratio ($R_{EXPECTED}$). For example, the predetermined percentage (X %) may be 80%, and the number N of power steps may be selected as one power step if the detected ratio ($R_{DETECTED}$) is between 70% and 80% of the expected ratio ($R_{EXPECTED}$), two power steps if the detected ratio ($R_{DETECTED}$) is between 60% and 70% of the expected ratio ($R_{EXPECTED}$), and so on. After reducing the adjustable power control signal ($V_{GAIN}$) by N power steps, the algorithm returns to step 302.

It should be noted that, after determining that the adjustable power control signal ($V_{GAIN}$) is to be reduced by N power steps, the baseband processor 20 waits until the beginning of the next transmit burst to adjust the adjustable power control signal ($V_{GAIN}$). The algorithm 300 does not adjust the adjustable power control signal ($V_{GAIN}$) during a burst. It detects when the power amplifier circuitry 38 is in compression based on samples of the detect signal ($V_{DETECT}$) during a transmit burst, and then decides if the adjustable power control signal ($V_{GAIN}$) is to be adjusted for the next transmit burst.

FIG. 3B illustrates exemplary steps of the algorithm 300 that occur if the detected ratio ($R_{DETECTED}$) is greater than or equal to the predetermined percentage (X %) of the expected ratio ($R_{EXPECTED}$), which means that the power amplifier circuitry 38 is not in compression. Steps 312–328 are exemplary and not necessary for the present invention. In general, steps 312–328 are exemplary steps for periodically determining if the adjustable power control signal ($V_{GAIN}$) has been previously reduced due to detecting compression of the power amplifier circuitry 38. If so, steps 312–328 attempt to increase the adjustable power control signal ($V_{GAIN}$) to its ideal value ($V_{GAIN,IDEAL}$). It should also be noted that steps 312–328, or any variation thereof, do not necessarily flow from steps 302–310 of FIG. 3A. Alternatively, steps 312–328 may be steps of the algorithm 300 performed periodically by the baseband processor 20 independent from steps 302–310.

Referring to FIG. 3B, at this point, the baseband processor 20 determines whether a time (T) has lapsed since a previous comparison of the adjustable power control signal ($V_{GAIN}$) to its ideal value ($V_{GAIN,IDEAL}$) (step 312). The time (T) may be any amount of time determined by the designer and depends on the particular implementation. If the time (T) has not lapsed, the algorithm 300 returns to step 302. If the time (T) has lapsed, the baseband processor 20 then determines if the adjustable power control signal ($V_{GAIN}$) is less than its ideal value ($V_{GAIN,IDEAL}$) (step 314). In one embodiment, the ideal value ($V_{GAIN,IDEAL}$) is a value corresponding to a desired output power level communicated to the wireless terminal 10 from a base station within a wireless communication network serving the wireless terminal 10. If the adjustable power control signal ($V_{GAIN}$) is not less than its ideal value ($V_{GAIN,IDEAL}$), then the algorithm 300 returns to step 302.

If the adjustable power control signal ($V_{GAIN}$) is less than its ideal value ($V_{GAIN,IDEAL}$), the baseband processor 20 increases the adjustable power control signal ($V_{GAIN}$) by one power step (step 316). It should be noted that the adjustable power control signal ($V_{GAIN}$) may be increased by one or more power steps rather than one power step if needed or desired. Next, the detect signal ($V_{DETECT}$) is sampled at a first time when the output power of the power amplifier circuitry 38 (FIG. 1) is ideally equal to a first output power level (step 318). Next, the detect signal ($V_{DETECT}$) is sampled at a second time when the output power is ideally equal to a second output power level (step 320). The detected ratio ($R_{DETECTED}$) is then calculated as a ratio of the first and second samples of the detect signal ($V_{DETECT}$) obtained in steps 318 and 320 (step 322). Next, the adjustable power control signal ($V_{GAIN}$) is compared to ideal value ($V_{GAIN,IDEAL}$) (step 324). If the adjustable power control signal ($V_{GAIN}$) is equal to its ideal value ($V_{GAIN,IDEAL}$), then the algorithm 300 returns to step 302. Otherwise, the algorithm 300 proceeds to step 326. It should be noted that step 324 may be performed immediately after step 316 in order to avoid unnecessary performance of steps 318–322 in the case where the adjustable power control signal ($V_{GAIN}$) is equal to its ideal value ($V_{GAIN,IDEAL}$).

Next, the detected ratio ($R_{DETECTED}$) is compared to the expected ratio ($R_{EXPECTED}$) (step 326). If the detected ratio ($R_{DETECTED}$) is greater than or equal to the predetermined percentage (X %) of expected ratio ($R_{EXPECTED}$), then the power amplifier circuitry 38 is not in compression. Thus, the algorithm 300 returns to step 316 where the adjustable power control signal ($V_{GAIN}$) is again increased by one power step. Steps 316–326 are iteratively repeated until the adjustable power control signal ($V_{GAIN}$) is equal to its ideal value ($V_{GAIN,IDEAL}$) or the power amplifier circuitry 38 goes into compression ($R_{DETECTED}$<X %*$R_{EXPECTED}$). If the detected ratio ($R_{DETECTED}$) is less than the predetermined percentage (X %) of expected ratio ($R_{EXPECTED}$), then the power amplifier circuitry 38 is in compression, and the adjustable power control signal ($V_{GAIN}$) is reduced by one power step (step 328). The algorithm 300 then returns to step 302.

Thus, in sum, steps 312–322 operate to avoid unnecessarily reducing the adjustable power control signal ($V_{GAIN}$) after a condition causing premature saturation is removed. For example, if the user of the wireless terminal 10 holds the wireless terminal 10 such that the antenna 16 is close to his body, then the compression point of the power amplifier circuitry 38 changes. In response, the algorithm 300 detects compression of the power amplifier circuitry 38 and reduces the adjustable power control signal ($V_{GAIN}$) such that the power amplifier operates linearly. Once the user moves the antenna 16 away from his body, the compression point of the power amplifier circuitry 38 returns to its designed value, and steps 312–322 operate to increase the adjustable power control signal ($V_{GAIN}$) back to its ideal value, or a point where the power amplifier circuitry 38 again goes into compression, such that the output power is not unnecessarily reduced.

FIG. 4 illustrates an exemplary amplitude waveform present at the output of the power amplifier circuitry 38 of FIG. 1 for an exemplary transmit burst. In this example, the exemplary amplitude waveform is an EDGE amplitude waveform where amplitude modulation is provided and the output power of the power amplifier circuitry 38 varies according to the amplitude modulation during the transmit burst.

The compression detection algorithm of the present invention operates to sample the detect signal ($V_{DETECT}$) at the first and second times ($t_1$, $t_2$) during the transmit burst. The first and second times ($t_1$, $t_2$) may occur at any time during the transmit burst. In this embodiment, the first time ($t_1$) occurs after the adjustable power control signal ($V_{GAIN}$) is ramped up but prior to the beginning of the amplitude modulation. As such, the output power of the power amplifier circuitry 38 at the first time ($t_1$) is equal to an output power level corresponding to the adjustable power control signal ($V_{GAIN}$) at the first time ($t_1$), which is equal to an average output power of the power amplifier circuitry 38 for the first transmit burst. The second time ($t_2$) may then be selected to be at a time corresponding to a peak of the amplitude modulation. As such, the detected ratio ($R_{DETECTED}$) is equal to a detected peak-to-average ratio. As described above, the detected ratio ($R_{DETECTED}$) is compared to an expected ratio ($R_{EXPECTED}$). Based on the comparison, the baseband processor 20 determines if the power control circuitry 38 is in compression. If so, the baseband processor 20 reduces the adjustable power control signal ($V_{GAIN}$) by N power steps for the next transmit burst.

It should be noted that there is no requirement that the first and second times ($t_1$, $t_2$) be selected such that the detected ratio ($R_{DETECTED}$) is a peak-to-average ratio. Since the baseband processor 20 knows, or can determine, the expected ratio ($R_{EXPECTED}$) for the output power for any two points in time, the times ($t_1$, $t_2$) can be any time during the transmit burst.

The present invention provides substantial opportunity for variation without departing from the spirit or scope of the present invention. For example, the baseband processor 20 may obtain the samples of the output power for every transmit burst, every Nth burst, or periodically as needed or desired. As another example, the algorithm 300 may be completely performed by the baseband processor 20. However, the baseband processor 20 may alternatively cooperate with the control system 22 to perform the algorithm 300.

Those skilled in the art will recognize improvements and modifications to the preferred embodiments of the present invention. All such improvements and modifications are considered within the scope of the concepts disclosed herein and the claims that follow.

What is claimed is:

1. A method of detecting compression of power amplifier circuitry comprising:
   providing a detect signal correlated to an output power of the power amplifier circuitry;
   sampling the detect signal at a first time corresponding to a first ideal output power of the power amplifier circuitry to obtain a first sample;
   sampling the detect signal at a second time corresponding to a second ideal output power of the power amplifier circuitry to obtain a second sample;
   determining whether the power amplifier circuitry is in compression based on the first and second samples; and
   reducing an adjustable power control signal controlling the output power of the power amplifier circuitry by a number of power steps if the power amplifier circuitry is in compression.

2. The method of claim 1 further comprising repeating the steps of providing the detect signal, sampling the detect signal at the first time, sampling the detect signal at the second time, determining whether the power amplifier circuitry is in compression, and reducing the adjustable power control signal if the power amplifier circuitry is in compression.

3. The method of claim 1 wherein the number of power steps is one.

4. The method of claim 1 wherein the power amplifier circuitry is included in a transmitter of a wireless terminal, and the first and second times at which the sampling steps occur during a transmit burst of the transmitter of the wireless terminal.

5. The method of claim 4 wherein reducing the adjustable power control signal by the number of power steps comprises reducing the adjustable power control signal by the number of power steps for subsequent transmit bursts.

6. The method of claim 1 wherein determining whether the power amplifier circuitry is in compression comprises:
   calculating a detected ratio based on the first and second samples;
   comparing the detected ratio to an expected ratio; and
   determining that the power amplifier circuitry is in compression if the detected ratio is less than a predetermined percentage of the expected ratio.

7. The method of claim 6 wherein determining whether the power amplifier circuitry is in compression further comprises determining the expected ratio based on the first and second ideal output powers.

8. The method of claim 7 wherein the power amplifier circuitry is included in a transmitter of a wireless terminal, and sampling the detect signal at the first time comprises sampling the detect signal at the first time during the transmit burst corresponding to a time at which an average output power occurs, and sampling the signal at the second time comprises sampling the detect signal at the second time during the transmit burst corresponding to a time at which a peak output power occurs, such that the detected ratio is a detected peak-to-average ratio.

9. The method of claim 1 further comprising:
   determining whether a predetermined period of time has lapsed since the adjustable power control signal has been compared to an ideal value of the adjustable power control signal;
   comparing the adjustable power control signal to the ideal value of the adjustable power control signal if the predetermined period of time has lapsed; and
   increasing the adjustable power control signal by one power step if the adjustable power control signal is less than the ideal value.

10. The method of claim 9 further comprising, after increasing the adjustable power control signal by one step:
    sampling the detect signal at third time corresponding to third ideal output power of the power amplifier circuitry to obtain a third sample;
    sampling the detect signal at a fourth time corresponding to a fourth ideal output power of the power amplifier circuitry to obtain a fourth sample;
    determining whether the power amplifier circuitry is in compression based on the third and fourth samples;
    if the power amplifier circuitry is not in compression and the adjustable power control signal is not equal to an ideal value of the adjustable power control signal, increasing the adjustable power control signal by one power step and repeating the steps of sampling the detect signal at the third time, sampling the detect signal at a fourth time, determining whether the power control signal is in compression based on the third and fourth samples, and increasing the adjustable power control signal by one power step if the power amplifier circuitry is not in compression and the adjustable power control signal is not equal to the ideal value of the adjustable power control signal; and
    reducing the adjustable power control signal by one power step if the power amplifier circuitry is in compression.

11. A system for detecting compression of power amplifier circuitry comprising:
    means for providing a detect signal correlated to an output power of the power amplifier circuitry;
    means for sampling the detect signal at a first time corresponding to a first ideal output power of the power amplifier circuitry to obtain a first sample;
    means for sampling the detect signal at a second time corresponding to a second ideal output power of the power amplifier circuitry to obtain a second sample;
    means for determining whether the power amplifier circuitry is in compression based on the first and second samples; and
    means for reducing an adjustable power control signal controlling the output power of the power amplifier circuitry by a number of power steps if the power amplifier circuitry is in compression.

12. The system of claim 11 wherein the number of power steps is one.

13. The system of claim 11 wherein the power amplifier circuitry is included in a transmitter of a wireless terminal, and the first and second times are during a transmit burst of the transmitter of the wireless terminal.

14. The system of claim 13 wherein the means for reducing the adjustable power control signal by the number of power steps reduces the adjustable power control signal by the number of power steps for subsequent transmit bursts.

15. The system of claim 11 wherein the means for determining whether the power amplifier circuitry is in compression comprises:
   means for calculating a detected ratio based on the first and second samples;
   means for comparing the detected ratio to an expected ratio; and
   means for determining that the power amplifier circuitry is in compression if the detected ratio is less than a predetermined percentage of the expected ratio.

16. The system of claim 15 wherein the means for determining whether the power amplifier circuitry is in compression further comprises a means for determining the expected ratio based on the first and second ideal output powers.

17. The system of claim 16 wherein the power amplifier circuitry is included in a transmitter of a wireless terminal, and the first time corresponds to a time during the transmit burst at which an average output power occurs and the second time corresponds to a time during the transmit burst at which a peak output power occurs, such that the detected ratio is a detected peak-to-average ratio.

18. The system of claim 11 further comprising:
   means for determining whether a predetermined period of time has lapsed since the adjustable power control signal has been compared to an ideal value of the adjustable power control signal;
   means for comparing the adjustable power control signal to the ideal value of the adjustable power control signal if the predetermined period of time has lapsed; and
   means for increasing the adjustable power control signal by one power step if the adjustable power control signal is less than the ideal value.

19. The system of claim 18 further comprising:
   means for sampling the detect signal at a third time corresponding to a third ideal output power of the power amplifier circuitry to obtain a third sample after increasing the adjustable power control signal by one power step;
   means for sampling the detect signal at a fourth time corresponding to a fourth ideal output power of the power amplifier circuitry to obtain a fourth sample after increasing the adjustable power control signal by one power step;
   means for determining whether the power amplifier circuitry is in compression based on the third and fourth samples;
   means for increasing the adjustable power control signal by one power step if the power amplifier circuitry is not in compression and the adjustable power control signal is not equal to an ideal value of the adjustable power control signal; and
   means for reducing the adjustable power control signal by one power step if the power amplifier circuitry is in compression.

20. A system for detecting compression of power amplifier circuitry in a wireless terminal comprising:
   power amplifier circuitry adapted to amplify a radio frequency input signal;
   power control circuitry adapted to control an output power of the power amplifier circuitry based on an adjustable power control signal;
   detector circuitry providing a detect signal correlated to the output power of the power amplifier circuitry; and
   processing circuitry adapted to:
      sample the detect signal at a first time corresponding to a first ideal output power of the power amplifier circuitry to obtain a first sample;
      sample the detect signal at a second time corresponding to a second ideal output power of the power amplifier circuitry to obtain a second sample;
      determine whether the power amplifier circuitry is in compression based on the first and second samples; and
      reduce the adjustable power control signal by a number of power steps if the power amplifier circuitry is in compression.

21. The system of claim 20 wherein the processing circuitry is further adapted to repeatedly sample the detect signal to obtain samples, determine whether the power amplifier circuitry is in compression based on the samples, and reduce the adjustable power control circuitry by one power step if the power amplifier circuitry is in compression.

22. The system of claim 20 wherein the number of power steps is one.

23. The system of claim 20 wherein the power amplifier circuitry is included in a transmitter of the wireless terminal and the first and second times occur during a transmit burst of the transmitter of the wireless terminal.

24. The system of claim 23 wherein the processing circuitry is further adapted to reduce the adjustable power control signal by the number of power steps by reducing the adjustable power control signal by the number of power steps for subsequent transmit bursts.

25. The system of claim 20 wherein to determine whether the power amplifier circuitry is in compression, the processing circuitry is further adapted to:
   calculate a detected ratio based on the first and second samples;
   compare the detected ratio to an expected ratio; and
   determine that the power amplifier circuitry is in compression if the detected ratio is less than a predetermined percentage of the expected ratio.

26. The system of claim 25 wherein to determine whether the power amplifier circuitry is in compression, the processing circuitry is further adapted to determine the expected ratio based on the first and second ideal output powers.

27. The system of claim 26 wherein the first time corresponds to a time during the transmit burst at which an average output power occurs, and the second time corresponds to a time during the transmit burst at which a peak output power occurs, such that the detected ratio is a detected peak-to-average ratio.

28. The system of claim 20 wherein the processing circuitry is further adapted to:
   determine whether a predetermined period of time has lapsed since the adjustable power control signal has been compared to an ideal value of the adjustable power control signal;
   compare the adjustable power control signal to the ideal value of the adjustable power control signal if the predetermined period of time has lapsed; and
   increase the adjustable power control signal by one power step if the adjustable power control signal is less than the ideal value.

29. The system of claim 28 wherein the processing circuitry is further adapted to, after increasing the adjustable power control signal by one power step:
   sample the detect signal at a third time corresponding to a third ideal output power of the power amplifier circuitry to obtain a third sample;

sample the detect signal at a fourth time corresponding to a fourth ideal output power of the power amplifier circuitry to obtain a fourth sample;

determine whether the power amplifier circuitry is in compression based on the third and fourth samples;

increase the adjustable power control signal by one power step if the power amplifier circuitry is not in compression and the adjustable power control signal is not equal to an ideal value of the adjustable power control signal; and reduce the adjustable power control signal by one power step if the power amplifier circuitry is in compression.

* * * * *